United States Patent [19]

Graube et al.

[11] Patent Number: 5,775,955
[45] Date of Patent: Jul. 7, 1998

[54] MODULAR FIELDBUS TERMINAL BLOCK

[76] Inventors: Maris Graube. 4247 NW. Half Mile La., Forest Grove. Oreg. 97116; Ferrous Steinka. 18570 SW. Alderwood Dr., Aloha, Oreg. 97006

[21] Appl. No.: 710,466

[22] Filed: Sep. 17, 1996

[51] Int. Cl.[6] ............................... H01R 9/22
[52] U.S. Cl. ................ 439/717; 439/716; 439/928
[58] Field of Search ................... 439/716, 717, 439/532, 928, 651

[56] References Cited

U.S. PATENT DOCUMENTS 4,698,726  10/1987  Ootsuka et al. ............... 439/716
5,545,060  8/1996  Gow ............................ 439/717

Primary Examiner—Gary F. Paumen

[57] ABSTRACT

A modular terminal block for a Fieldbus digital communications loop includes a housing having a set of wiring terminals interconnected by an internal bus line. The terminal block is adapted to be selectively mounted on a DIN rail and has plug-compatible male and female connectors for coupling to other terminal blocks without the use of external wiring.

13 Claims, 4 Drawing Sheets

MODULAR FIELDBUS TERMINAL BLOCK

BACKGROUND OF THE INVENTION

Many industries such as petrochemical processing require plant operations that are controlled by a plurality of sensors such as temperature and pressure gauges which are located in the field with the processing equipment. In the field there are also actuators such as valve controllers and pumps. The sensors and actuators communicate with a control room that contains computers and personnel who operate the plant. The wiring between the control room computers and the sensors and actuators in the field is critical to the operation of the plant. The conventional communications standard between the field and the control room is a 4-20 mA current loop having a protocol defined by the Instrument Society of America and known as ISA Standard S50.1. This protocol has been used in conventional processing plants for years and comprises an analog signal sent on a pair of wires. One wire provides power to the sensor and the sensor varies the amount of current it sends back to the control room on the other wire as an indication of the measured value. Actuators can also be controlled using the 4-20 mA method.

Subsequently, the ISA has defined a standard known as ISA SP50.02 for digitally transmitting field information over a shielded twisted pair of wires. Digital transmission has a number of advantages such as reduced noise susceptibility and the ability to convey different kinds of information. It is this type of communications method that is commonly known as Fieldbus. Using Fieldbus, power is transmitted over the pair of wires leading from the sensor to the control room and a digital signal is superimposed on the same wire pair. Digital communications are inherently more reliable than analog systems as long as the integrity of the wiring is not compromised. Another large advantage of a Fieldbus communications system is that many devices, sensors and actuators can use the same wire pair to communicate with control room equipment or each other. This is because each sensor or actuator connected to the Fieldbus can have a unique digital code and respond only to commands preceded by that code.

Typically a plurality of devices are connected to a control room by a shielded twisted pair cable sometimes referred to as the "home run." Field devices can be connected to a common wire terminal commonly called a "crowfoot" at a field junction box. Devices can also be connected along the home run cable with "spurs." A terminator is needed at each end of the Fieldbus cable to allow the twisted pair to carry digital signals, otherwise reflections of the digital signal would occur. The Fieldbus cable also provides power to the attached devices and power conditioners are needed to separate a conventional power supply from the signal on the Fieldbus.

The conventional method of wiring analog type loops uses barrier strips. These are panels of terminals that contain lugs for the connection of wires. The home run wires are terminated in a field junction box. Terminals on the field junction box are in turn joined with pairs of wires to each device. In the control room the home run wires are connected to a marshalling panel which is then joined with wires to the controller. With a digital Fieldbus, such terminal strips are difficult to use. This is because several devices must be attached to the Fieldbus wires at the crowfoot and in the control room. This requires that the terminal strip elements be interconnected. This in turn requires that several wires be placed under the same screw terminal lug which is an unreliable wiring practice. With two or three wires connected to each screw type terminal or lug there is ample opportunity for short circuits and inadvertent grounding. To provide a true digital Fieldbus, all of the terminals must be wired together so that a single signal from the home run wire is provided to each of the terminals to which a sensor or actuator is individually attached.

SUMMARY OF THE INVENTION

A modular terminal block for a Fieldbus communications loop includes a housing having a plurality of internally interconnected terminal sets mounted within a block housing, a set of male output connectors coupled to the terminal sets and positioned at a first end of the block housing and a set of female input connectors coupled to the terminal sets and mounted at an opposite end of the block housing. The block housings are adapted to be mounted on a DIN rail and include movable tabs slidable with respect to the block housing for engaging the DIN rails.

One or more of the modular Fieldbus terminal blocks may be interconnected to make up a system by sliding the blocks together along the DIN rail so that the male connectors on one terminal block matingly engage the female connectors on an adjacent block. Each terminal block includes an internal bus line interconnecting all of the terminals on each block, thus eliminating the need to wire terminals together for digital Fieldbus communications. Each terminal block may include a pilot light connected to a power input terminal to provide an indication that power is present. Other modular terminal blocks may include terminators and power conditioners, and all are compatible with the modular terminal blocks by virtue of the ability of each block to be mounted on a DIN rail and interconnect via the male and female external connectors.

Each of the terminal blocks include a longitudinal slot in the bottom of its housing to accommodate a DIN rail. In addition, two lateral slots defined by an upper retaining lugs and lower guide flanges provide a lateral slot for slidable tabs which are selectively slidable through the slots to engage the DIN rails. The tabs may also have stops or detents to define selected lateral positions such as fully engaged and open. The tabs may also include a slider portion and a foot portion. The foot portion has a reinforced region containing a mounting aperture so that the terminal blocks may be hard mounted to a flat surface. With either mounting scheme, the male and female connectors of adjacent terminal blocks are in alignment so that two or more terminal blocks may be plugged together to provide the number of terminal blocks desired.

The internal bus completely eliminates the need for the external wiring of sets of terminals and the attendant complexity of having two or more wires connected to the same terminal. Because of the internal bus connecting all of the terminals on a terminal block and the input and output connectors, any number of terminals may be coupled together on a common bus by selecting the desired number of terminal blocks. Special function terminal blocks such as lightening arresters, power conditioners and terminators may also be provided in plug-compatible engagement with the terminal blocks to provide a terminal system of the type that might be required at a crowfoot junction. In addition the female plugs on any block may be used to connect a temporary device or test equipment to the Fieldbus wiring. This may be convenient for field personnel performing maintenance or troubleshooting tasks.

The foregoing and other objectives, features, and advantages of the invention will be more readily understood upon

3 consideration of the following detailed description of the invention, taken in conjunction with the accompanying drawings.

DETAILED DESCRIPTION OF THE PREFERRED EMBODIMENT

Figure 1:
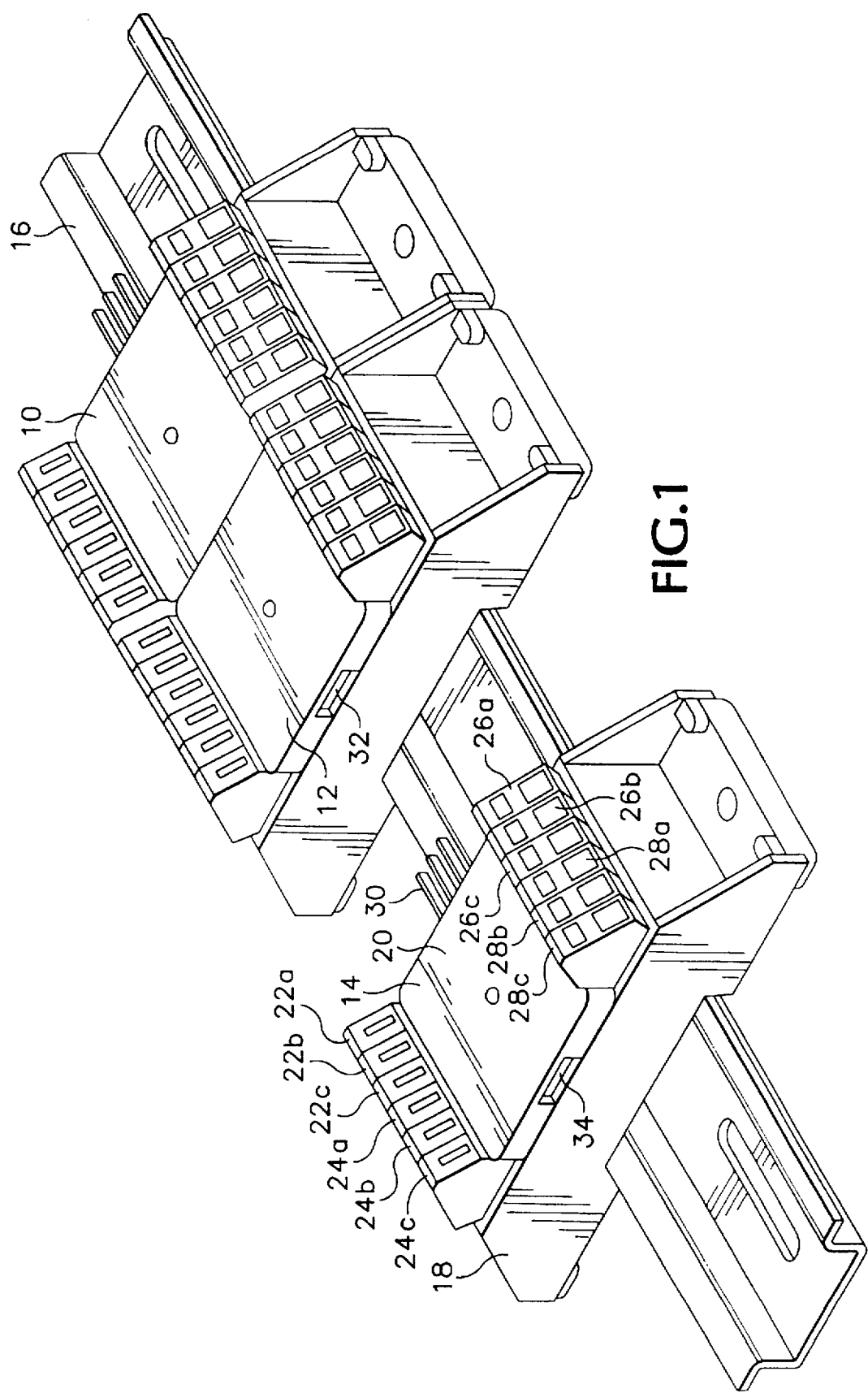
FIG. 1 is a perspective view of several of the modular terminal blocks of the invention mounted on a DIN rail.
Figure 2:
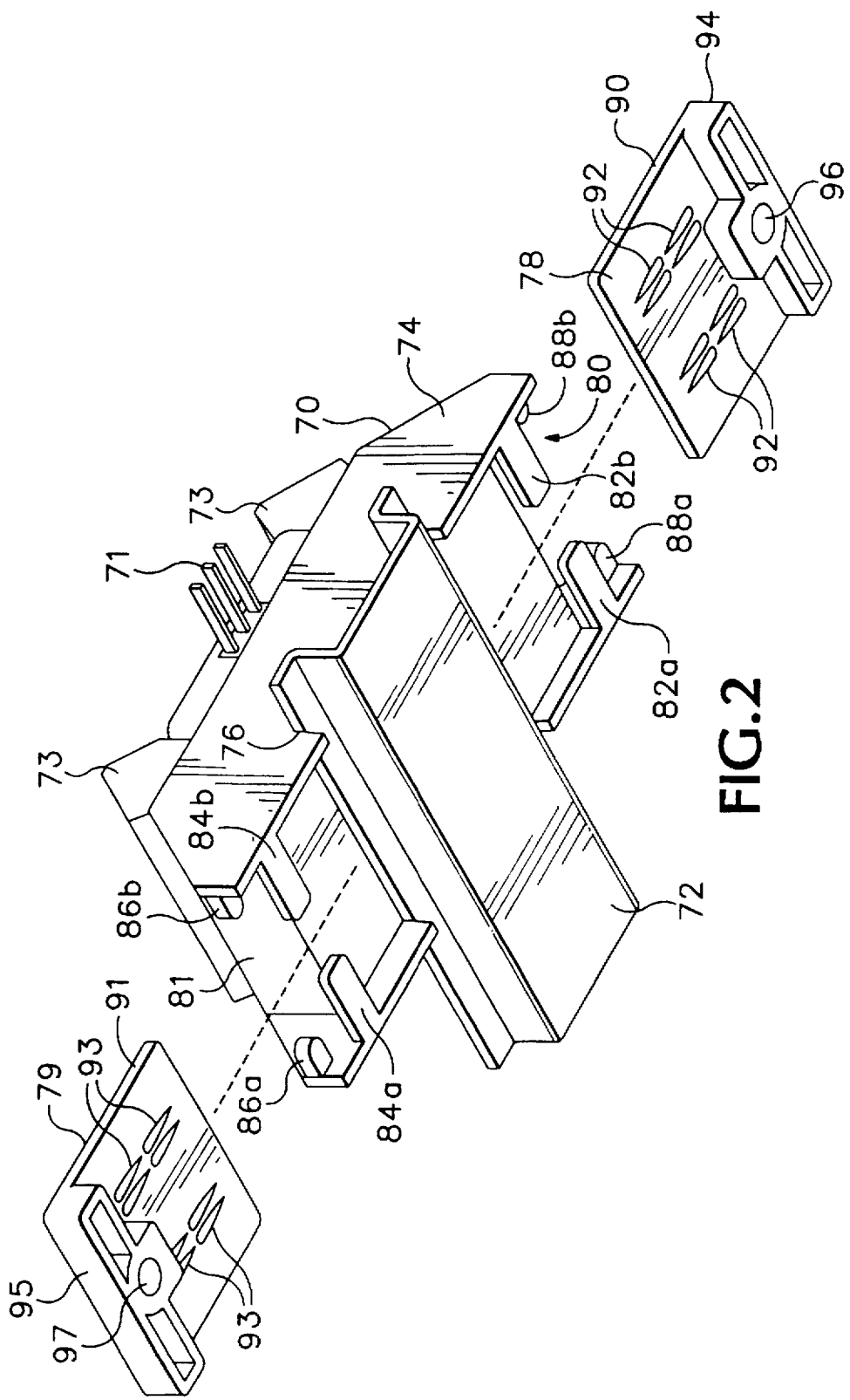
FIG. 2 is a bottom perspective view of a terminal block mounted on a DIN rail illustrating the manner in which is slidable tabs connect the terminal block to the DIN rail.

Referring to FIG. 1 a plurality of modular terminal blocks 10, 12 and 14 for a Fieldbus communications loop are mounted on a DIN rail 16. Reference will be made to terminal block 14 since terminal blocks 10 and 12 are identical.

Modular terminal block 14 includes a block housing 18 which includes a top cover plate 20 and a plurality of wiring terminals. There are twelve separate wiring terminals on terminal block 14 which are arranged in sets of three. Terminals 22a, 24a, 26a and 28a are negative input terminals. Terminals 22b, 24b, 26b, and 28b are shield terminals and terminals 22c, 24c, 26c and 28c are positive input terminals. These terminals are of the spring-loaded type which are readily available from commercial sources.

The terminal block 14 includes a male output connector 30 which cooperatively mates with an adjacent female input connector 32 on terminal block 12. The terminal block 14 also includes a female input connector 34.

Figure 6:
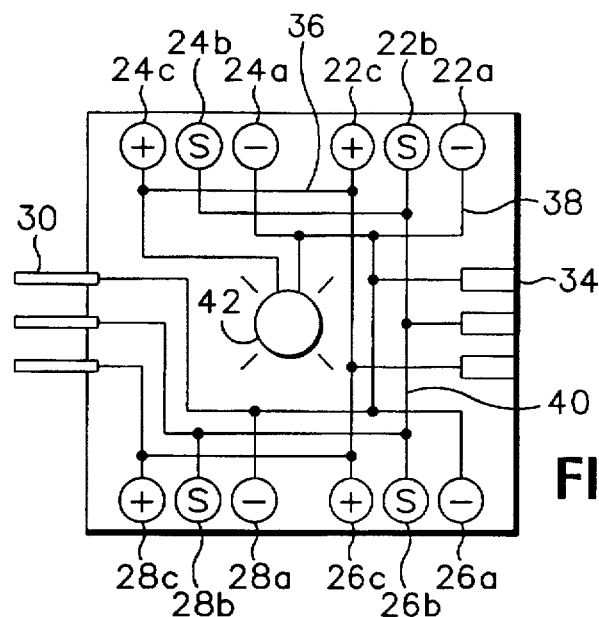
FIG. 6 is an internal wiring diagram of a modular terminal block of the invention.

The internal wiring of terminal block 14 (and terminal blocks 10 and 12) is shown in FIG. 6. In FIG. 6 the twelve electrical terminals on terminal block 14 are indicated by the symbols "+", "s" and "−." All of the four terminal sets are identical. The positive inputs are labeled "+," the negative inputs are labeled "−" and the "s" inputs are for a shield. As mentioned above, the home run cable is a shielded twisted pair. Internally all of the plus, minus and shield terminals are connected together on respective internal bus lines. The positive bus line is line 36, the negative line is line 38 and the shield bus is line 40. The bus lines 36, 38 and 40 also connect the positive, negative and shield terminals to respective pins on the male output connector 30 and the female input connector 34. A pilot light or indicator light 42 is provided by coupling an LED or other suitable light emitting device between the positive and negative bus lines 36 and 38. Thus, respective lines 36, 38 and 40 make up an internal bus line which may be provided to an input connector 34 and an output connector 30 so that multiple terminal blocks such as blocks 10, 12 and 14 may be coupled together to form a terminal block system suitable for a digital Fieldbus communication loop.

4

Figure 7:
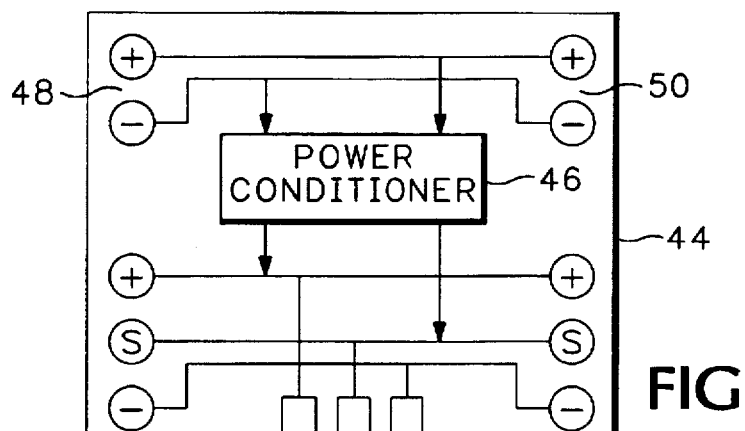
FIG. 7 is a wiring diagram of a modular terminal block employing a power conditioner.
Figure 8:
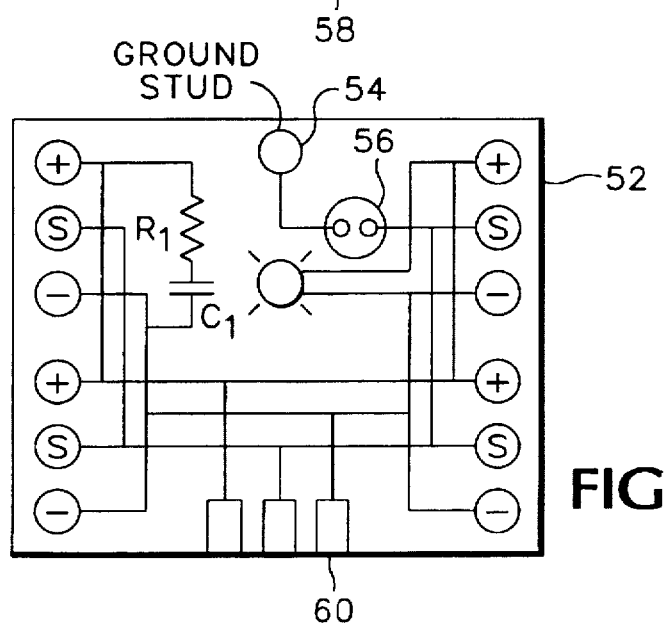
FIG. 8 is a wiring diagram of a modular terminal block having a terminator circuit.

FIGS. 7 and 8 show other types of terminal blocks which may be included within a modular system. For example, FIG. 7 shows a terminal block 44 which includes a power conditioner circuit 46. On block 44 there are two sets of power terminals 48 and 50 for connecting the block 44 to a power supply and to other power conditioner blocks. In FIG. 8 a terminator block 52 is shown which includes a termination circuit comprising resistor R1 and capacitor C1. A ground stud 54 is provided which may connect the shield line to ground through a spark gap 56 (that makes a connection to ground when a given voltage across its terminals is exceeded) and may thus act as a lightening arrestor. Both the power conditioner block 44 and the terminator block 52 include female input connectors 58 and 60, respectively, which enable these blocks to be combined with other terminal blocks such as blocks 10, 12 and 14 as well as having positive, negative and shield terminals.

Referring to FIGS. 2, 3, 4 and 5 collectively, a modular terminal block 70 is mounted on a DIN rail 72. The terminal block 70 includes a housing 74 which includes a cutout area or longitudinal slot 76 which fits over the DIN rail 72. Terminal block 70 includes a male output connector 71, wiring terminals 73 and a female input connector at the end opposite male connector 71. The rail 72 is engaged by slidable tabs 78 and 79 which slide through lateral slots 80 and 81 in the housing 74 as indicated by the dashed lines. The slots 80 and 81 are defined by respective lower flange members 82a, 82b, 84a and 84b in conjunction with upper lug members 86a, 86b, 88a, and 88b. The tabs 78 and 79 have slider portions 90 and 91, respectively, which contain detents or stops 92 and 93, respectively, on the underside of each. The respective detents 92 and 93 interact with the lower guide flanges 84a and 84b and 82a and 82b to determine the lateral position of the tabs 78 and 79 in the respective lateral slots 80 and 81. When the tabs 78 and 79 are pushed all the way into the slots 80 and 81, respectively, the DIN rail 72 is engaged so as to hold the housing 74 of the terminal block 70 securely on the rail 72. The slots 80 and 81 are journalled into the housing 74 slightly below the longitudinal slot 76 so that the tabs 78 and 79 slide beneath the lateral portions of the rail 72. The block 70 may be released from rail 72 by pulling the tabs 78 and 79 to the first detent position.

Figure 3:
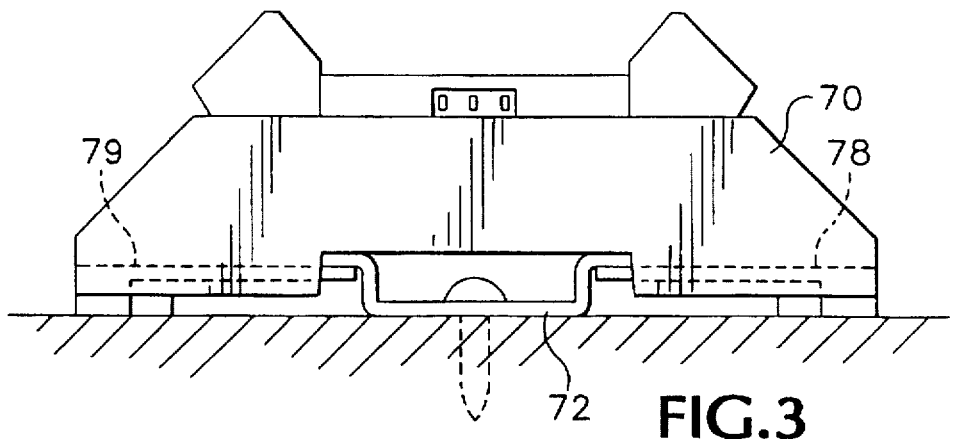
FIG. 3 is a front view of a typical modular terminal block of the invention mounted on a DIN rail.
Figure 4:
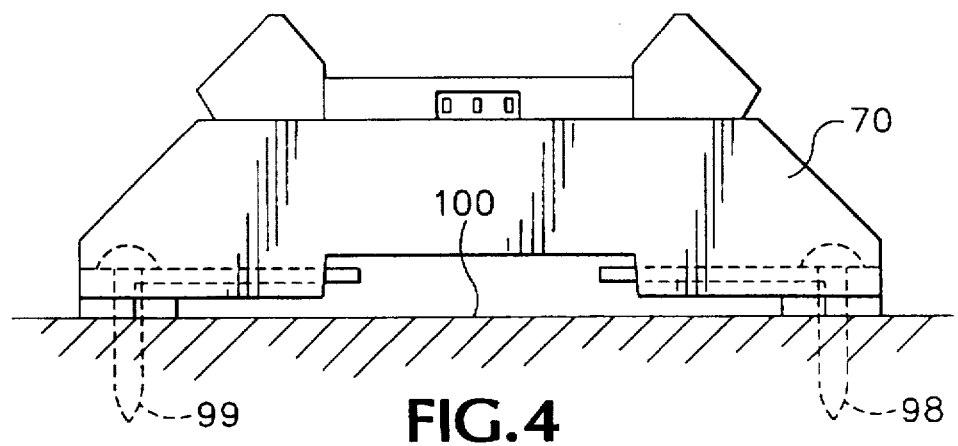
FIG. 4 is a front view of the terminal block of FIG. 3 mounted on a hard flat surface with screws.
Figure 5:
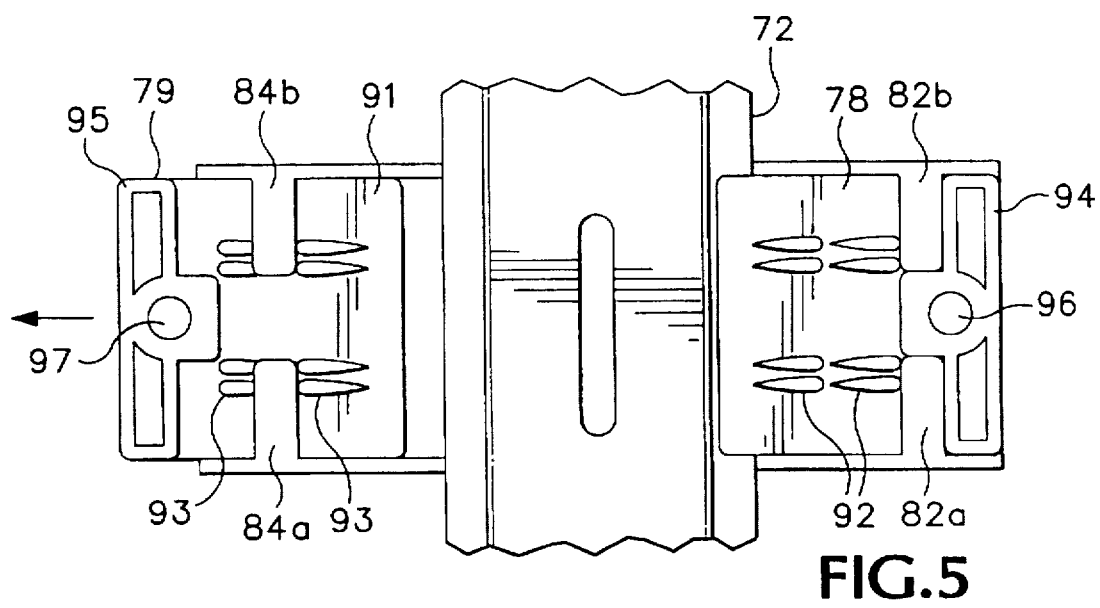
FIG. 5 is a partial bottom view of the modular terminal block of FIG. 3 connecting to a DIN rail.

Additionally, the tabs 78 and 79 each have foot portions 94 and 95, respectively. The bottom of the foot portions 94 and 95 are flush with the bottom of the DIN rail 72. Additionally, the foot portions 94 and 95 each have an aperture 96 and 97, respectively, which can be used for hard mounting the terminal block 70 to a flat surface. This feature is shown more particularly in FIG. 4 in which screws 98 and 99 are used to mount the terminal block 70 to a hard flat surface 100. Thus, the terminal block 70 may be either selectively mounted on a permanently installed DIN rail 72 as shown in FIG. 3 or may be mounted flush against a hard surface as shown in FIG. 4.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A modular terminal block for a digital communication loop comprising a plurality of interconnected terminal sets mounted within a block housing, a set of male output connectors coupled to the terminal sets and positioned at a first end of the block housing, and a set of female input connectors coupled to the terminal sets and mounted at an opposite end of the block housing, said male output connectors adapted to be mated with the female input connectors of a similar terminal block.

2. The modular terminal block of claim 1, further comprising a pair of movable tabs slidable within said block housing for engaging a DIN rail.

3. The modular terminal block of claim 2 wherein each of said movable tabs include a slider portion and a foot portion, the foot portion including an aperture for receiving a screw or bolt.

4. The modular terminal block of claim 3 wherein said block housing includes a pair of lower guide flanges for receiving said tabs, said tabs including a plurality of stop members for engaging said lower guide flanges at one or more lateral positions.

5. The modular terminal block of claim 1, further including a current indicator light.

6. A modular terminal block system for a digital communications loop comprising a plurality of interconnected terminal blocks, each terminal block in said plurality comprising a plurality of sets of electrical terminals, each set including a positive terminal, a negative terminal and a shield terminal, the positive terminal of each set being connected to a positive bus, the negative terminal of each set being connected to a negative bus, and the shield terminal of each set being connected to a shield bus, the positive bus the negative bus and the shield bus all being connected to respective input and output connectors for coupling one of said terminal blocks to another one of said terminal blocks within said plurality.

7. The modular terminal block system of claim 6 wherein said plurality of interconnected terminal blocks are mounted on a DIN rail.

8. The multiple terminal block system of claim 7 wherein at least one of said plurality of interconnected terminal blocks includes a set of male electrical connectors which electrically engage a set of female electrical connectors on an adjacent terminal block in said plurality.

9. A modular terminal block for a digital communications loop comprising:

a) a housing;

b) a plurality of electrical terminals affixed to the housing, said plurality comprising at least positive and negative terminals, the positive and negative electrical terminals being connected to respective positive and negative bus lines;

c) a pair of tabs slidably disposed with respect to said housing for engaging a DIN rail; and d) a male output connector having positive and negative pins connected to said positive and negative internal bus lines respectively for compatibly mating with a female input connector of an adjacent modular terminal block.

10. The modular terminal block of claim 9 wherein said pair of tabs each having mounting foot portions including a mounting aperture, said mounting foot portions being laterally slidably adjustable between selected lateral positions.

11. The modular terminal block of claim 9 wherein said housing includes a top side and a bottom side, said top side providing a mounting area for said electrical terminals and said bottom side providing a longitudinal slot for receiving said DIN rail.

12. The modular terminal block of claim 11 wherein said housing includes a pair of lateral slots for said tabs, said lateral slots being formed by upper retaining lugs and lower guide flanges on each side thereof.

13. The modular terminal block of claim 12 wherein said tabs include detents interacting with said lower guide flanges to define said selected positions.

* * * * *